United States Patent
Orimoto et al.

(10) Patent No.: US 7,202,128 B1
(45) Date of Patent: Apr. 10, 2007

(54) METHOD OF FORMING A MEMORY DEVICE HAVING IMPROVED ERASE SPEED

(75) Inventors: Takashi Whitney Orimoto, Mountain View, CA (US); Harpreet K. Sachar, Milpitas, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 92 days.

(21) Appl. No.: 11/165,330

(22) Filed: Jun. 24, 2005

(51) Int. Cl.
*H01L 21/336* (2006.01)

(52) U.S. Cl. .................... 438/257; 438/954; 257/368

(58) Field of Classification Search ............. 438/257, 438/258, 262, 954; 257/368, 369, 382
See application file for complete search history.

(56) References Cited

U.S. PATENT DOCUMENTS

| | | | |
|---|---|---|---|
| 6,706,595 B2 | 3/2004 | Yang et al. | 438/258 |
| 6,780,708 B1 | 8/2004 | Kinoshita et al. | 438/241 |
| 6,787,840 B1 | 9/2004 | Pham et al. | 257/313 |
| 6,808,996 B1 | 10/2004 | Pham et al. | 438/303 |
| 6,815,292 B1 | 11/2004 | Fang et al. | 438/264 |
| 6,835,662 B1 * | 12/2004 | Erhardt et al. | 438/689 |

* cited by examiner

*Primary Examiner*—Phuc T. Dang
(74) *Attorney, Agent, or Firm*—Harrity Snyder LLP

(57) ABSTRACT

A method of forming a memory device includes forming a memory stack on a substrate. The memory stack includes an alumina layer acting as an intergate dielectric layer. A transistor is formed on the substrate in an area separate from the memory stack. The transistor is formed to include thin gate oxide via a dry oxidation technique and a gate layer on the thin gate oxide. The thin gate oxide is formed without subjecting the thin gate oxide to thermal annealing with $N_2O$.

20 Claims, 14 Drawing Sheets

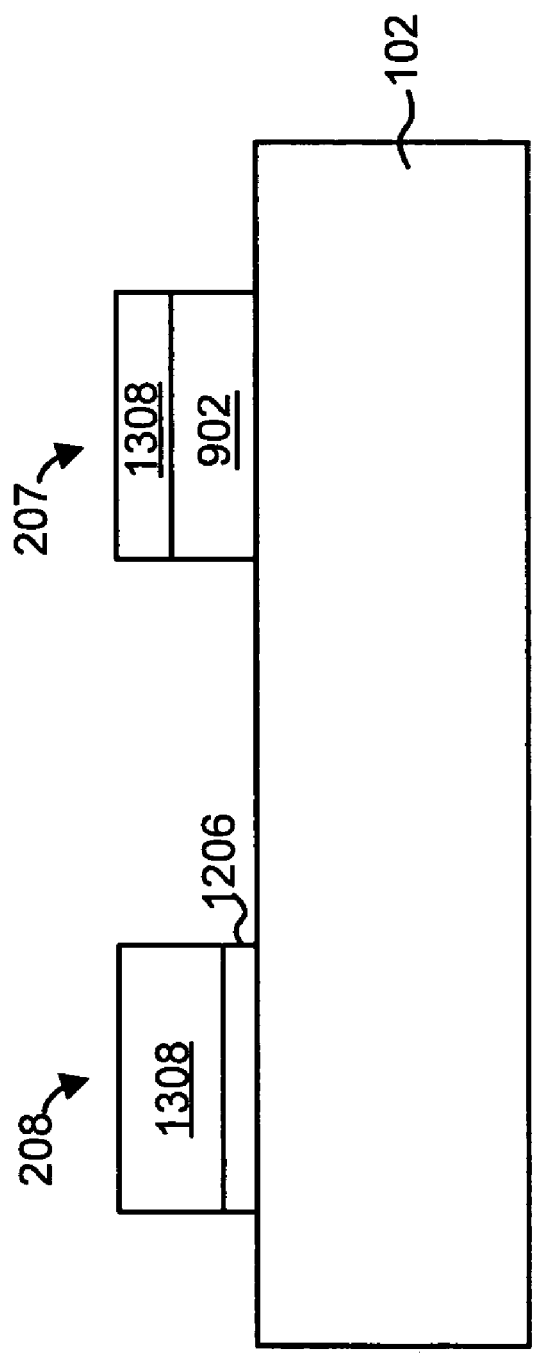

METHOD OF FORMING A MEMORY DEVICE HAVING IMPROVED ERASE SPEED

TECHNICAL FIELD

The present invention relates generally to methods of manufacturing semiconductor devices. The invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology.

One type of conventional electrically erasable programmable read only memory (EEPROM) device includes a silicon substrate with an oxide-nitride-oxide (ONO) stack formed on the substrate. A silicon control gate is formed over the ONO stack. This type of memory device is often referred to as a SONOS (silicon-oxide-nitride-oxide-silicon) type memory device. In a SONOS device, the nitride layer acts as the charge storage layer.

The SONOS type memory device may be programmed by a hot electron injection process that injects electrons into the nitride layer where they become trapped. The nitride layer may then store this negative charge.

The SONOS type memory device is typically erased using a hot hole injection (HHI) process. In some SONOS type memory devices, the oxide layer on the nitride layer may be augmented or replaced with a high K material, such as $Al_2O_3$. The addition of the high K material permits the SONOS memory device to be erased using mechanisms other than HHI. For example, Fowler-Nordheim (FN) erase mechanisms may be used.

One type of high K material that is used to supplement the ONO stack is alumina. For example, an aluminum oxide may be deposited on top of the top oxide layer to create an $Al_2O_3$-oxide-nitride-oxide (AONO) stack. In such a memory device, FN erase mechanisms can be used to erase the memory device. Accordingly, it would be desirable to be able to effectively form memory devices including a high-K layer, such as a memory device with an AONO stack.

DISCLOSURE OF THE INVENTION

Implementations consistent with the invention provide methods for manufacturing memory devices with high-K intergate dielectric layers.

One aspect is directed to a method of forming a memory device. The method includes forming a memory stack on a substrate, where the memory stack includes an alumina layer as an intergate dielectric. The method further includes forming a thin gate oxide on the substrate in an area separate from the memory stack using a dry oxidation technique and forming a gate layer on the thin gate oxide. The method is performed such that the thin gate oxide is formed without subjecting the thin gate oxide to thermal annealing with $N_2O$.

Another aspect is directed to a method of forming a memory device. The method includes forming an AONO (alumina-oxide-nitride-oxide) memory stack and forming a gate oxide, after formation of the AONO memory stack, using a dry oxidation technique. The gate oxide is formed without subjecting the gate oxide to thermal annealing to strengthen the gate oxide against breakdown.

BRIEF DESCRIPTION OF THE DRAWINGS

Reference is made to the attached drawings, wherein elements having the same reference number designation may represent like elements throughout.

FIGS. 9–14 are diagrams illustrating an exemplary method of manufacturing transistors in the periphery region of the device.

BEST MODE FOR CARRYING OUT THE INVENTION

Techniques described below relate to a method of manufacturing a semiconductor memory device. The memory device may be manufactured such that gate oxides applied to a periphery region of the device do not adversely interact with memory cells in a core region of the device.

Figure 1:
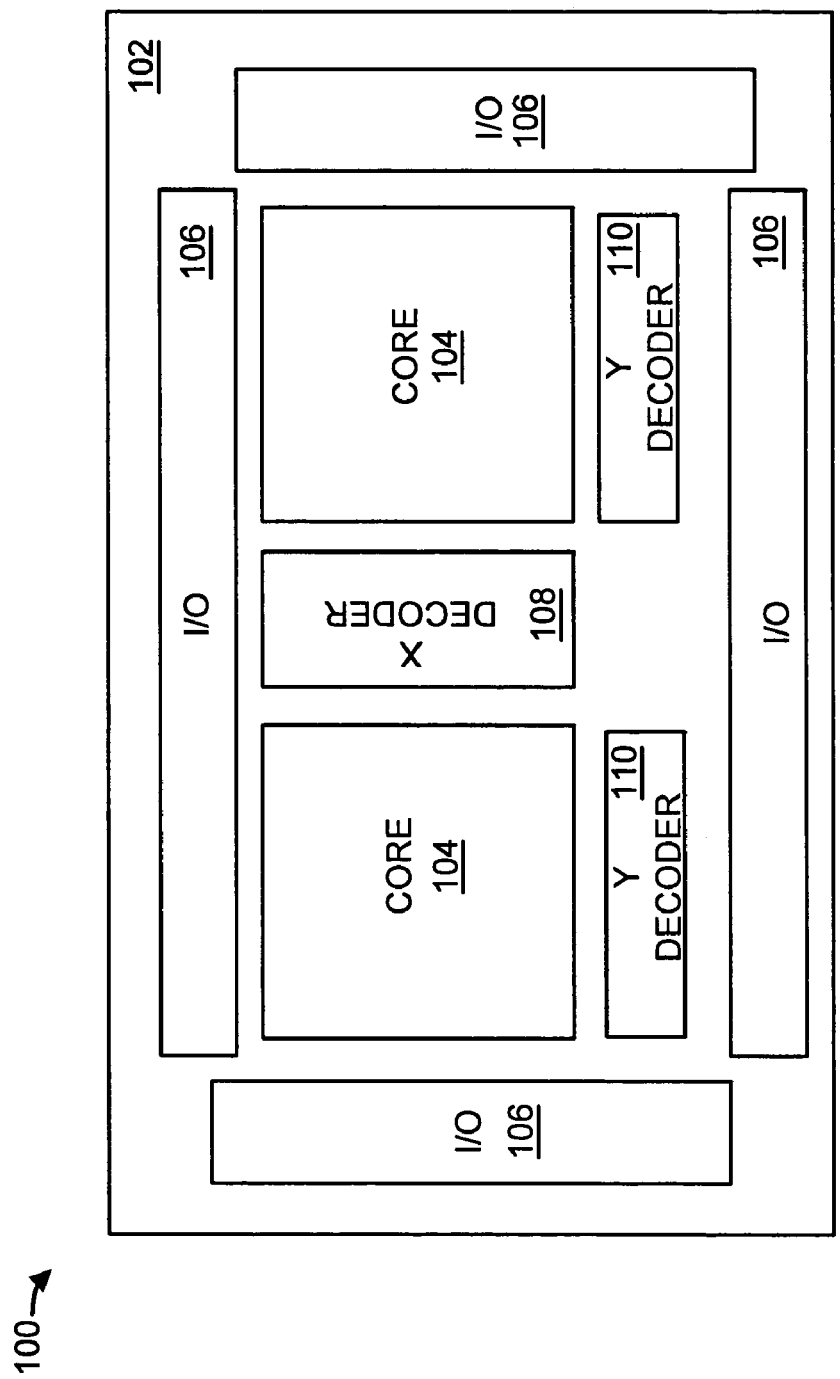
FIG. 1 is a diagram illustrating a layout of an exemplary EEPROM semiconductor device.

FIG. 1 is a diagram illustrating a layout of an exemplary EEPROM device 100. Device 100 may be formed on a semiconductor substrate 102 and packaged to form an integrated circuit chip. Substrate 102 can include one or more high-density core regions and one or more potentially lower density peripheral regions. Core regions may include one or more M×N memory array cores 104 of individually addressable, substantially identical memory cells. Low-density peripheral portions may include input/output (I/O) circuitry and programming circuitry for selectively addressing the individual memory cells. The programming is represented in FIG. 1 as one or more X-decoders 108 and Y-decoders 110 cooperating with I/O circuitry 106 for connecting the source, gate, and drain of selected addressed memory cells to predetermined voltages to perform operations, such as programming, reading, and erasing of the memory cells from array cores 104.

The peripheral regions on substrate 102 may include low-voltage transistors for handling logic and switching circuitry and high-voltage transistors for handling high-voltages encountered during memory programming and erase operations. One difference in the manufacture of high-voltage and low-voltage transistors is the thickness of the gate oxide layers. The high-voltage transistors may be formed with a thicker layer of gate oxide in order to handle the higher voltages without breaking down.

Figure 2:
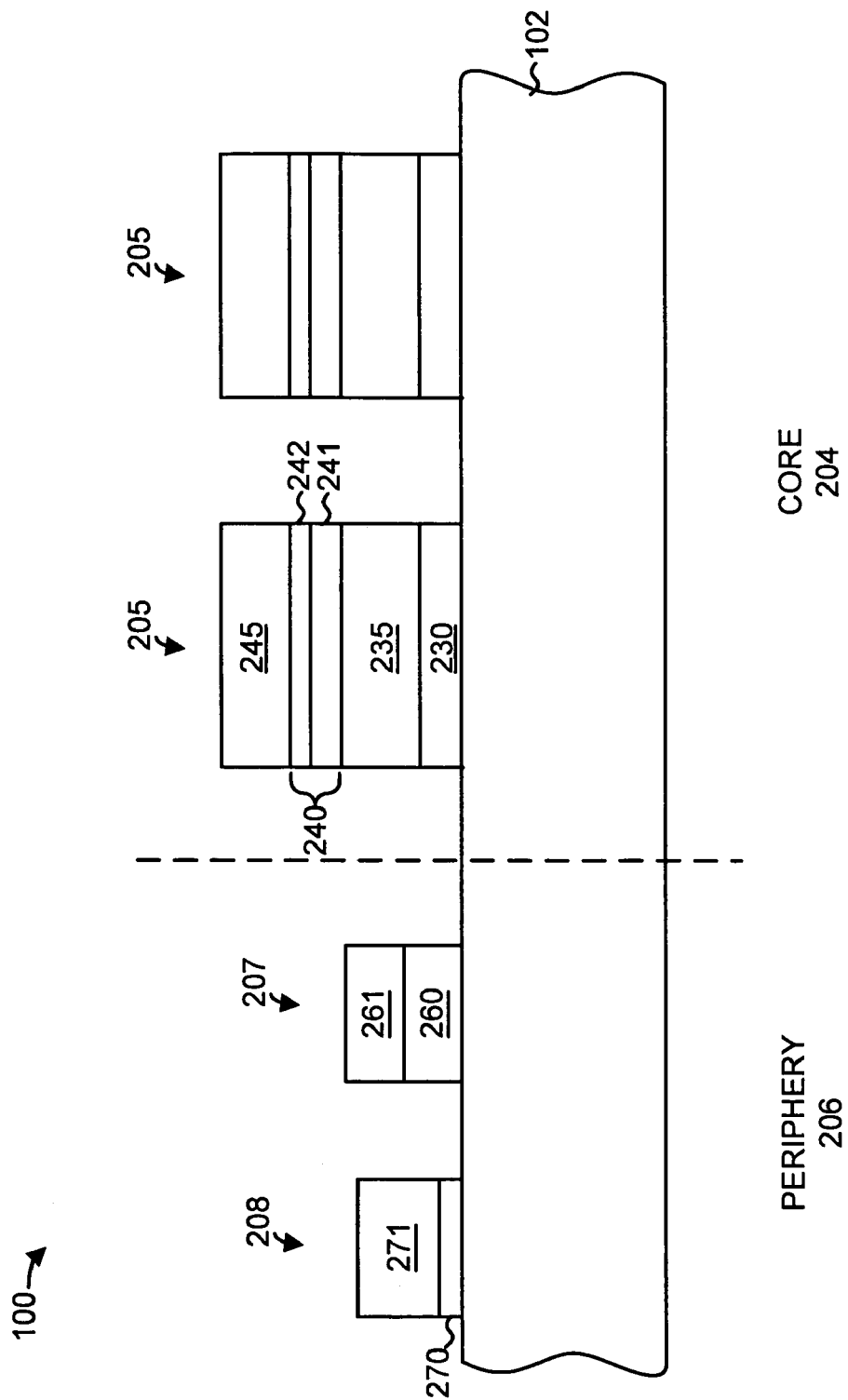
FIG. 2 is a cross-section of the semiconductor device shown in FIG. 1 illustrating portions of a core region and a periphery region of the device.

FIG. 2 is a cross-section of semiconductor device 100 illustrating portions of one of a core region 204 and portions of one of a periphery region 206 of semiconductor device 100. Core region 204 and periphery region 206 may be formed on semiconductor substrate 102.

Core region 204 may include SONOS type memory cells having vertical stack structures 205. Although only two memory cells are illustrated, in practice, core region 204 will typically include one or more arrays, each including a large number of memory cells.

Periphery region 206 may include, among other things, high voltage transistors 207 that have a relatively thick gate oxide layer and lower voltage transistors 208 that have a relatively thin gate oxide.

Referring to one of vertical stacks 205, a gate dielectric 230 may be formed on semiconductor substrate 102. A charge storing layer 235 may be formed on gate dielectric 230. An intergate dielectric 240 may be formed on charge storing layer 235. Intergate dielectric 240 may include high-K dielectric materials. In one implementation, intergate dielectric 240 may include an oxide (e.g., $SiO_2$) layer 241 and a high-K dielectric layer 242 formed over layer 241. High-K layer 242 may include, for example, an aluminum oxide ($Al_2O_3$) layer.

A control gate 245 may be formed on intergate dielectric 240. Gate dielectric 230, charge storing layer 235, intergate dielectric 240, and control gate 245 form vertical stack 205 of the memory cell.

Semiconductor substrate 102 may include any conventional substrate. For example, semiconductor substrate 102 may include a bulk silicon semiconductor substrate, a silicon-on-insulator (SOI) semiconductor substrate, a silicon-on-sapphire (SOS) semiconductor substrate, or a semiconductor substrate formed of other materials known in the art. The techniques described herein are not limited to any particular type of semiconductor substrate.

Gate dielectric 230 is shown as a single layer dielectric. Gate dielectric 230 may be made of suitable gate oxide dielectric materials, such as $SiO_2$. Gate dielectric 230 may have a thickness of, for example, between 30 and 80 Å. It should be understood by those skilled in the art that the gate dielectric 230 could be a multi-layer dielectric. For example, a layer of $SiO_2$ may be deposited on the semiconductor substrate 102 followed by another dielectric.

Charge storing layer 235 may be made of typical, well-known dielectric materials. For example, for SONOS-type memory cells, charge storing layer 235 may include a nitride material. In an exemplary embodiment, charge storing layer 235 may have a thickness of between about 30 and 150 Å.

Intergate dielectric 240 is disposed on charge storing layer 235. In an exemplary embodiment, high-K layer 242 of intergate dielectric 240 may have a thickness of between about 70 and 250 Å. Layer 241 may comprise an oxide, such as $SiO_2$, and may have a thickness of between about 30 and 150 Å. In some embodiments, layer 241 may not be included and intergate dielectric 240 will include only high-K dielectric layer 242, such as an aluminum oxide high-K layer 242.

Control gate 245 may be positioned on top of intergate dielectric layer 240. Control gate 245 may be made of typical, well-known gate electrode materials, such as, for example, polysilicon. Exemplary control gate 245 may have a thickness of between about 500 and 3000 Å.

Referring now to high voltage transistors 207 and low voltage transistors 208, each may include an oxide layer and a gate layer. High voltage transistors 207 may include a thick oxide layer 260 and a gate layer 261. Low voltage transistors 208 may include a thin oxide layer 270 and a gate layer 271. Thin oxide layer 270 may, for instance, be approximately 30 Å thick and thick oxide layer 260 may be approximately 160 Å thick.

Transistors 207 and 208 may generally be used to implement the circuitry in the peripheral region, such as select transistors and programming transistors relating to X decoder 108, Y decoder 110, and I/O lines 106.

The structures in core region 204 and periphery region 206 may be formed using a number of semiconductor processing techniques. Exemplary processing techniques will next be described for forming the structures in these regions, with reference to FIGS. 3–8 for core region 204 and with reference to FIGS. 9–14 for periphery region 206. Core region 204 and periphery region 206 may typically be formed simultaneously by forming and removing various layers over device 100, and by using various known isolation techniques such as LOCOS (LOCal Oxidation of Silicon) and shallow trench isolation techniques. For ease of understanding, however, the particular isolation techniques used will not be described in detail and the formation of the device structures will be described independently of one another with reference to FIGS. 3–8 and 9–14. One of ordinary skill in the art will recognize that in practice, core region 204 and periphery region 206 may be formed simultaneously and that different layers discussed with reference to these two regions may correspond to a single layer on device 100.

Method of Manufacture of Memory Cell Stacks 205

Figure 3:
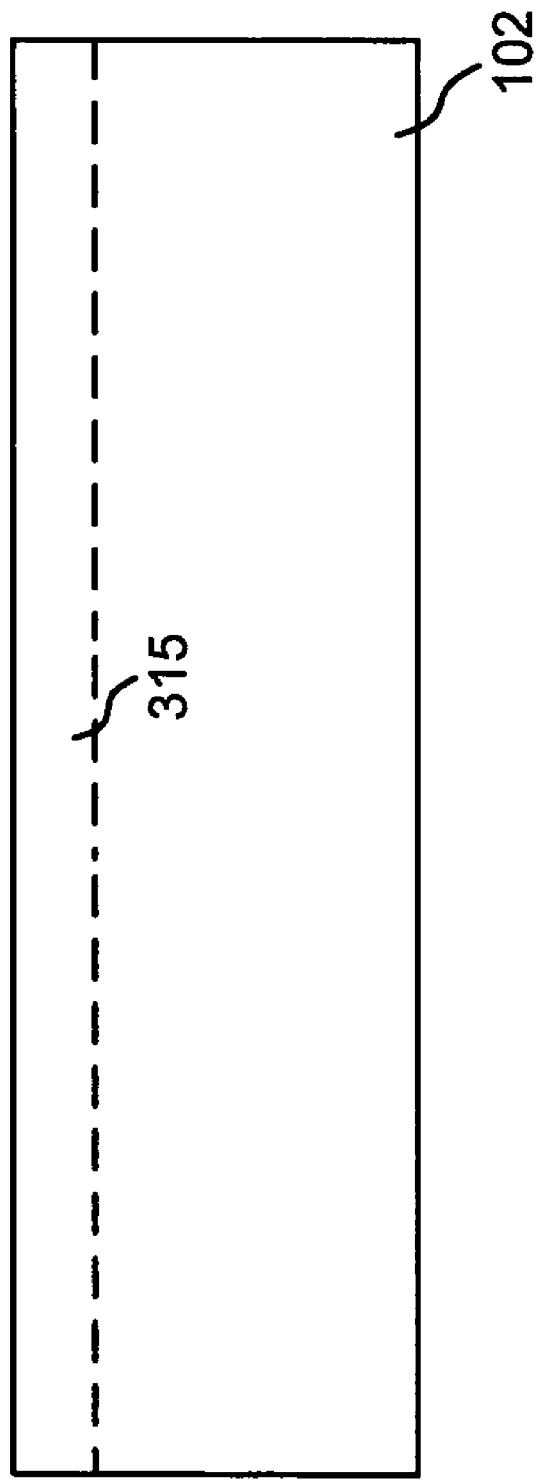
FIGS. 3–8 are diagrams illustrating an exemplary method of manufacturing a memory cell stack in the core region of the device.

FIGS. 3–8 are diagrams illustrating an exemplary method of manufacturing a memory cell stack 205. To begin, as shown in FIG. 3, semiconductor substrate 102 is provided. Semiconductor substrate 102 may be any appropriately selected semiconductor substrate known in the art. Semiconductor substrate 102 may be subjected to implants to provide an active region 315 in semiconductor substrate 102 as is known in the art. For instance, boron or indium may be implanted to form a p-type region or channel for an n-type device and phosphorous or arsenic may be implanted to form an n-type region or channel for a p-type device.

Figure 4:
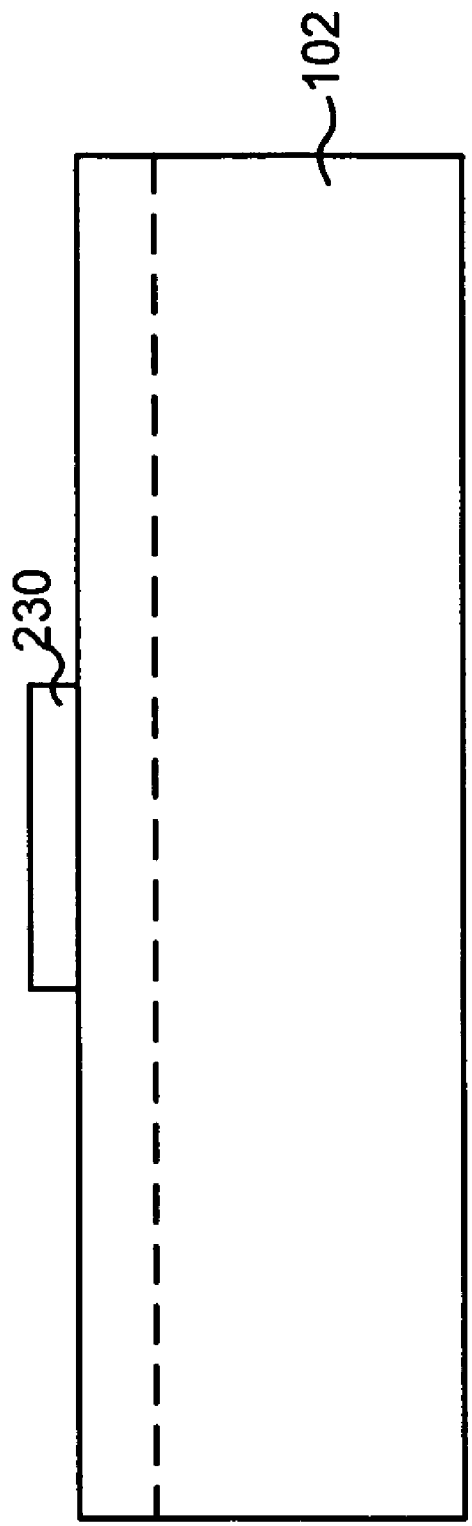
Figure 5:
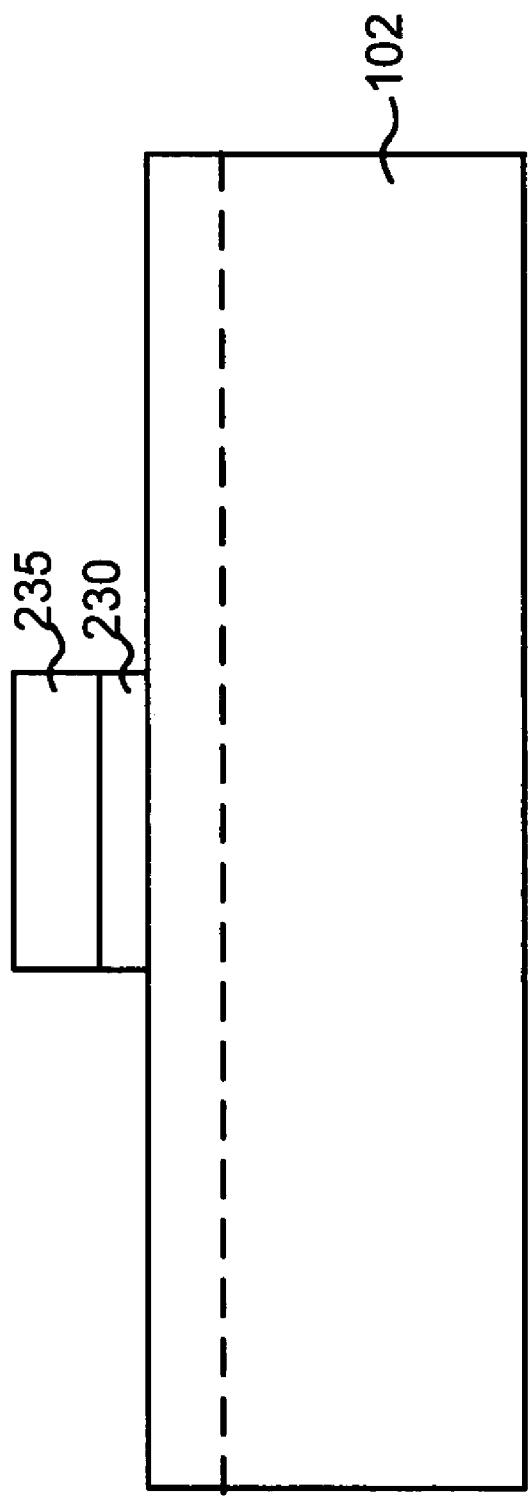

Now referring to FIG. 4, gate dielectric 230 may be formed on the semiconductor substrate 102. Gate dielectric 230 may comprise an oxide, such as $SiO_2$, and may be thermally grown or deposited to a thickness between 30 and 80 angstroms. Charge storing layer 235 may then be formed on gate dielectric 230 (FIG. 5). Charge storing layer 235 may be formed as a nitride layer and may be deposited to a thickness between about 30 and 150 Å. Alternatively, charge storing layer 235 may include a layer other than a nitride layer, other high-K materials, or another material capable of holding charge. In one embodiment, charge storing layer 235 may be implemented as a layer including a number of high-K materials.

Figure 6:
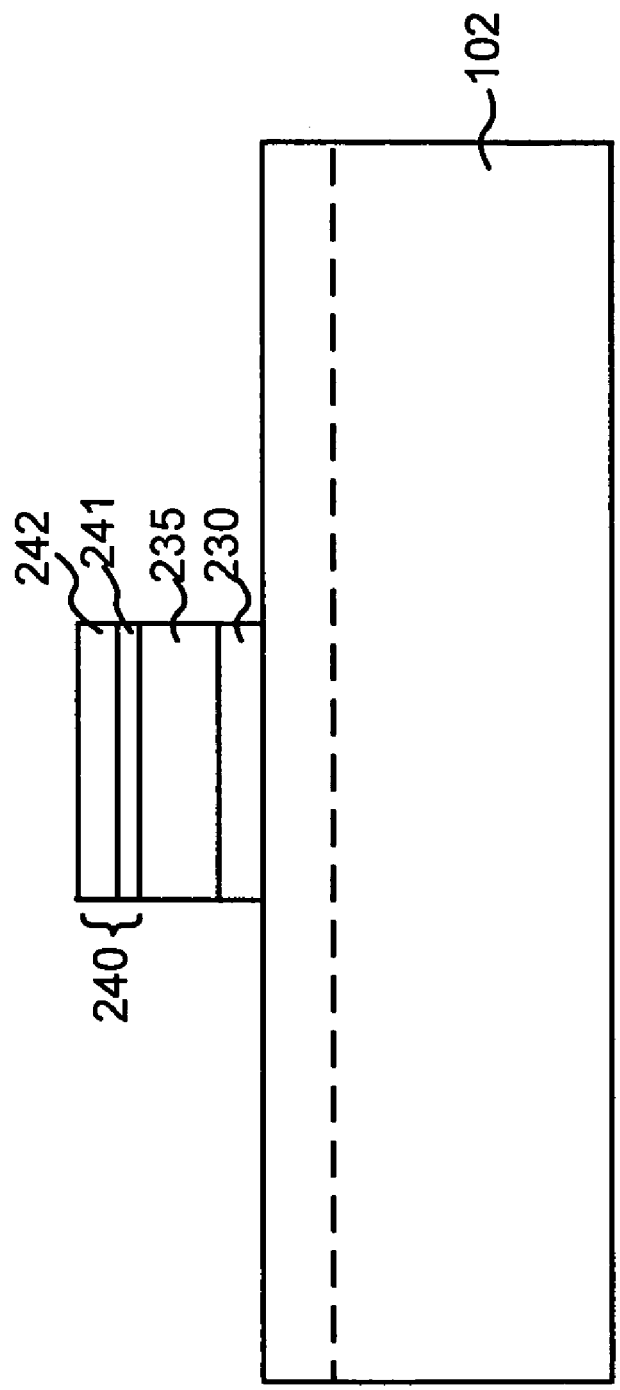

Referring to FIG. 6, an intergate dielectric 240 may next be formed on top of charge storing layer 235. Intergate dielectric 240 may include a $SiO_2$ layer 241 grown to a thickness between about 30 and 150 Å and a high-K layer 242 deposited on top of layer 241 to a thickness of about 70 to 250 Å. As previously mentioned, high-K layer 242 may include an aluminum oxide.

At some point, post-deposition annealing may be performed for high-K layer 242. For an $Al_2O_3$ high-K layer 242, exemplary annealing temperatures may range from 750° C. to 1150° C. and include an anneal duration from about 15 seconds to 30 minutes. The annealing may be performed using an inert ambient atmosphere (e.g., nitrogen). In general, higher annealing temperatures and longer annealing durations may result in improved erase speeds for the memory cell.

Additionally, it has been noticed that avoiding cleans directly on the high-K layer 242 can also improve the performance of the memory cell. More specifically, performing cleans directly on high-K layer 242, such as a high-K $Al_2O_3$ layer, can degrade the erase speed of the memory cell.

Figure 7:
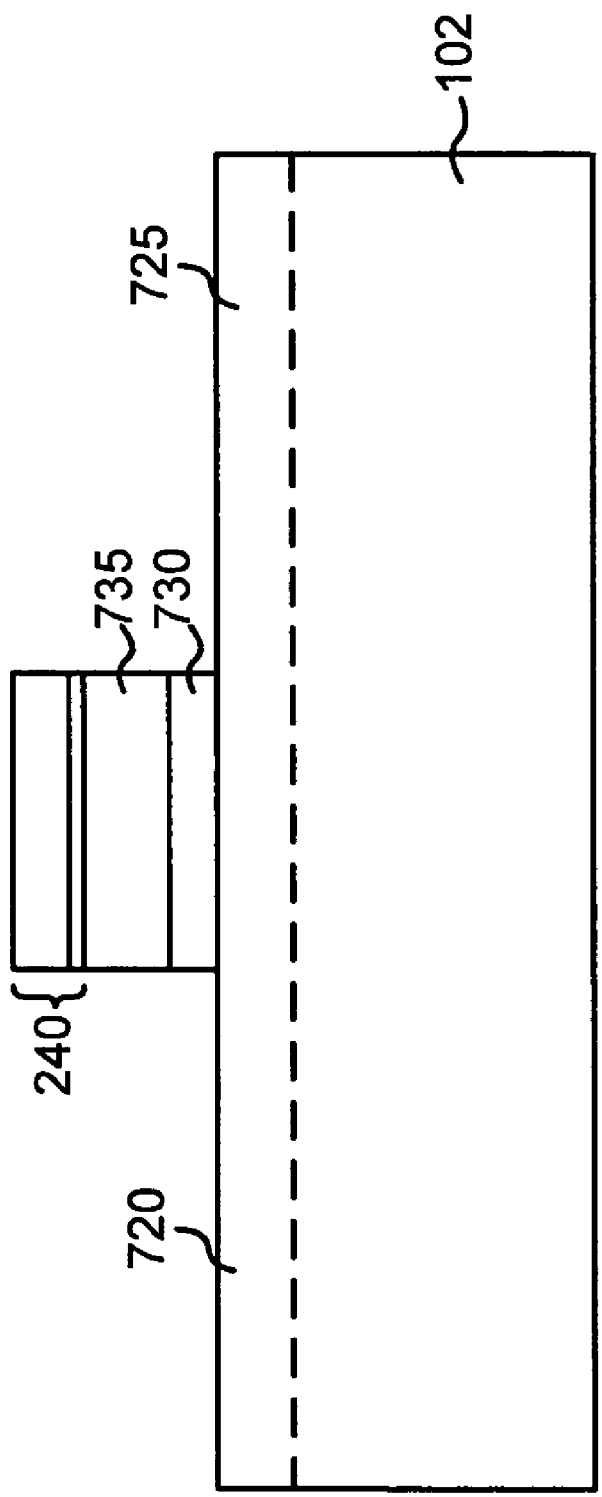

Referring to FIG. 7, the semiconductor substrate 102 may next be subjected to implants to produce source region 720 and drain region 725. Source region 720 and drain region 725 may be formed by a main perpendicular implant. The main perpendicular implant is a relatively high energy, high concentration implant which is capable of producing source 120 and the drain 125. Boron, arsenic, or phosphorous may be used alone or in any combination as the dopant. Other p-type or n-type impurities may alternatively be used.

Although source region 720 and drain region 725 are shown as single implantation regions, it should be understood that another implantation process may be performed to form extension regions as is known in the art. It should also be understood that the formation of source region 720 and drain region 725 may take place before the formation of the charge storing layer 235 or after the formation of vertical stack 205.

Figure 8:
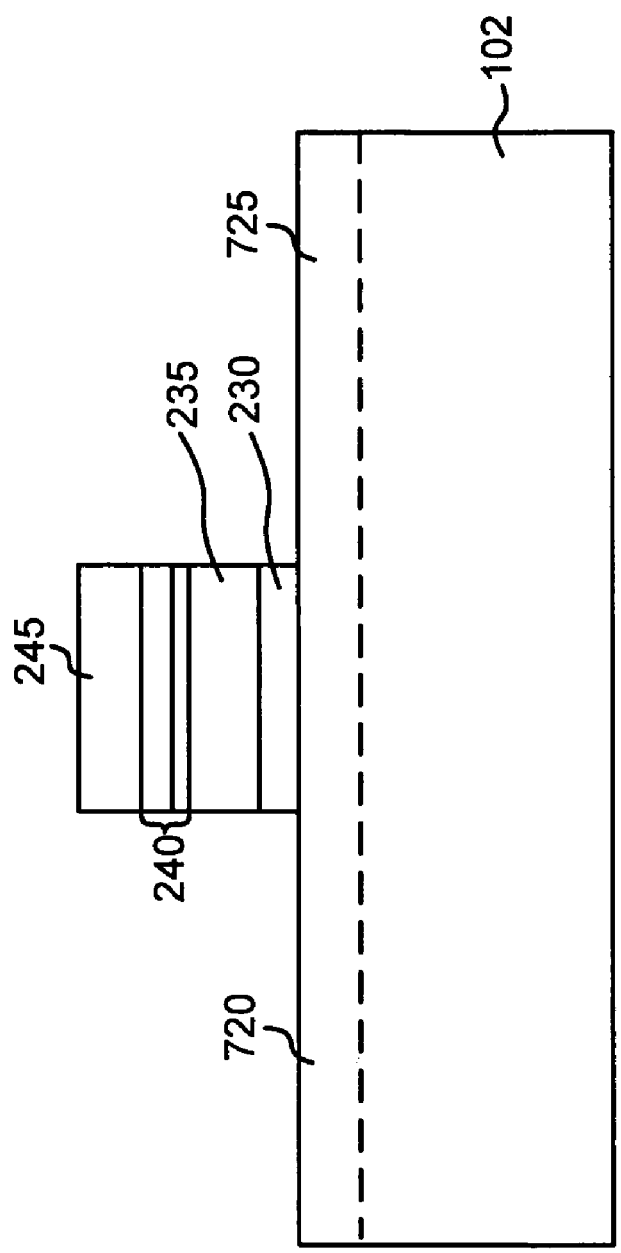

Referring to FIG. 8, an undoped polysilicon layer 245 may be deposited and patterned on the intergate dielectric layer 240. The polysilicon may then be doped using an implantation process to implant the polysilicon. Alternatively, layer 245 may be pre-doped.

Method of Manufacture of Transistor Stacks 207 and 208

FIGS. 9–14 are diagrams illustrating an exemplary method of manufacturing transistors 207 and 208.

Figure 9:
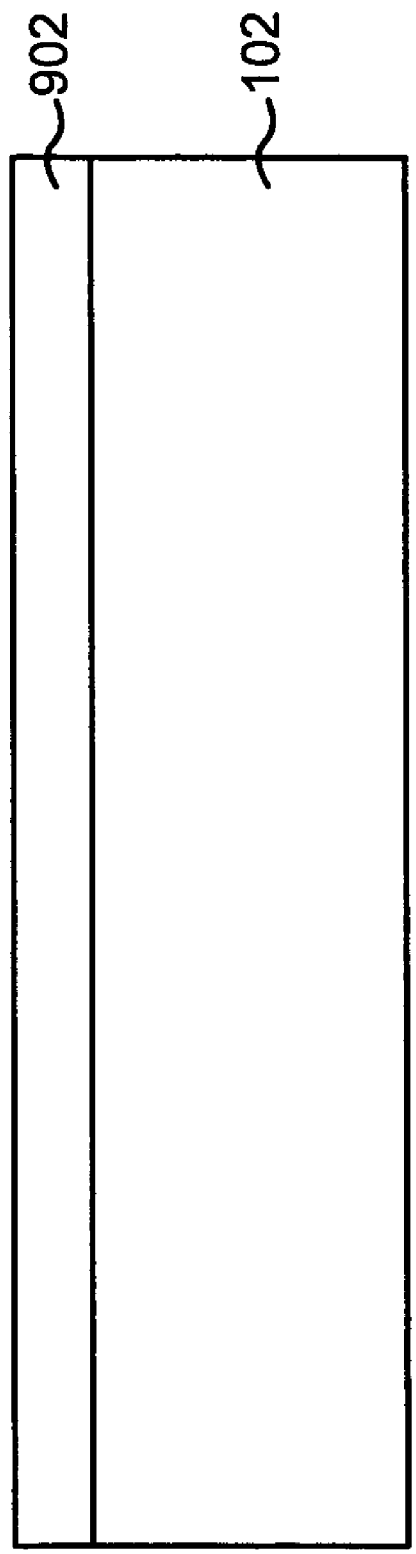

Referring to FIG. 9, substrate 102 may be subjected to a thermal oxidation which forms a first gate oxide layer 902 over the semiconductor substrate in the periphery region. First oxide layer 902 is a thick oxide that will eventually function as the primary oxide layer for higher voltage transistors 207. First oxide layer 902 may, for instance, be formed via a wet thermal oxidation at 850° C. in order to grow first oxide layer 902 to a thickness of approximately 160 Å. More generally, first oxide layer 902 may be formed to a thickness of between about 100 Å and 200 Å via steam oxidation performed at a temperature of between about 750° C. and 950° C.

Figure 10:
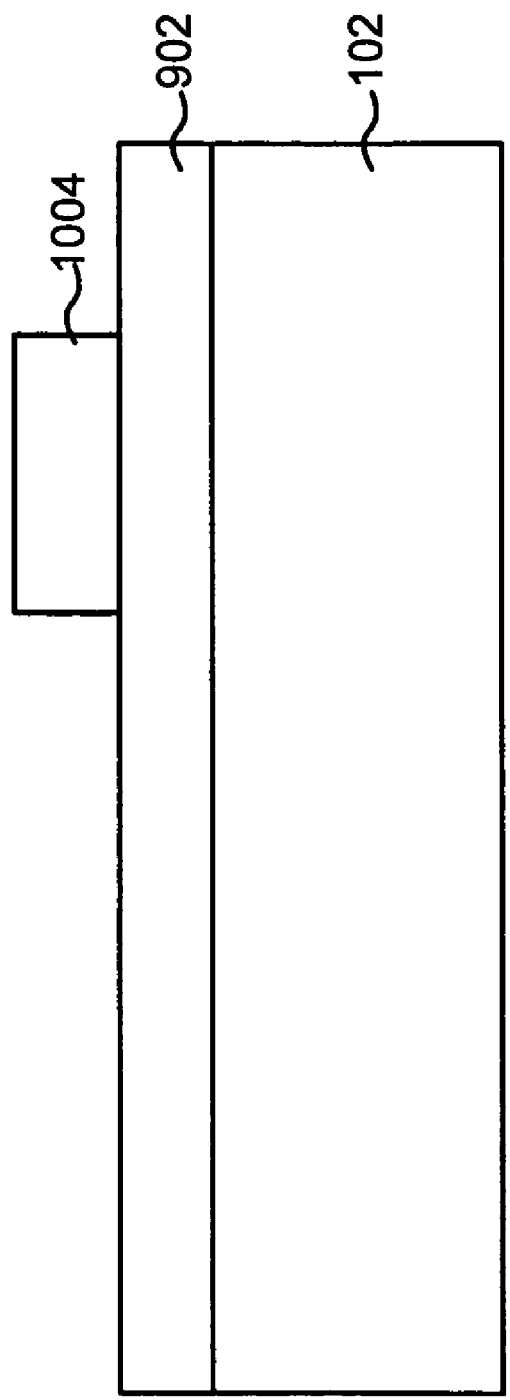
Figure 11:
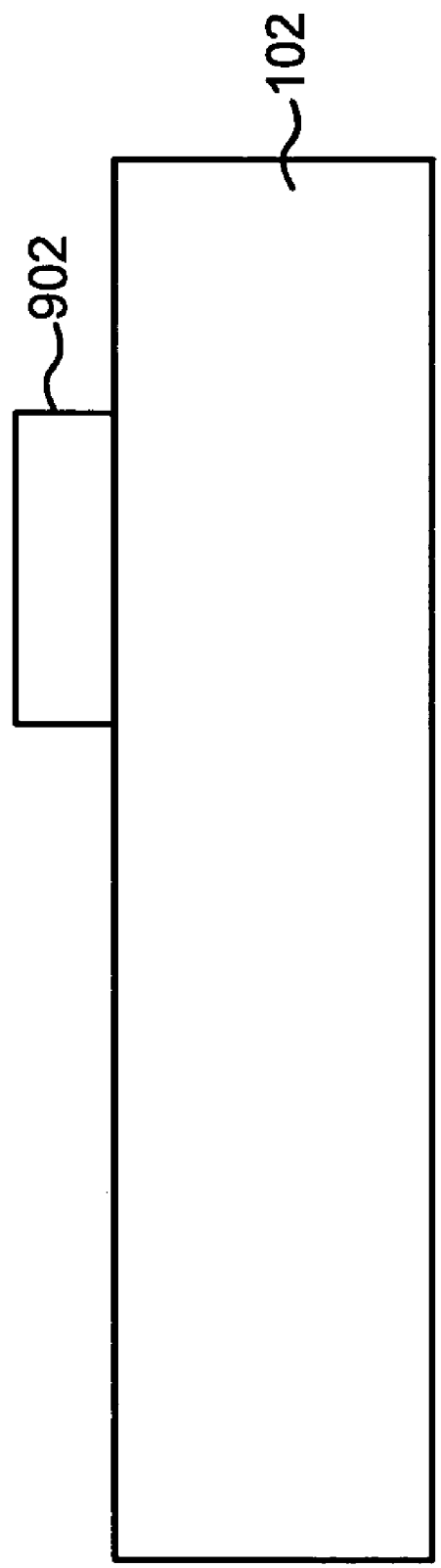

A photoresist mask 1004 may next be formed over portions of first gate oxide layer 902, as shown in FIG. 10. The portions of first gate oxide layer 902 not covered by photoresist mask 1004 may then be etched away and mask 1004 removed, as shown in FIG. 11.

Figure 12:
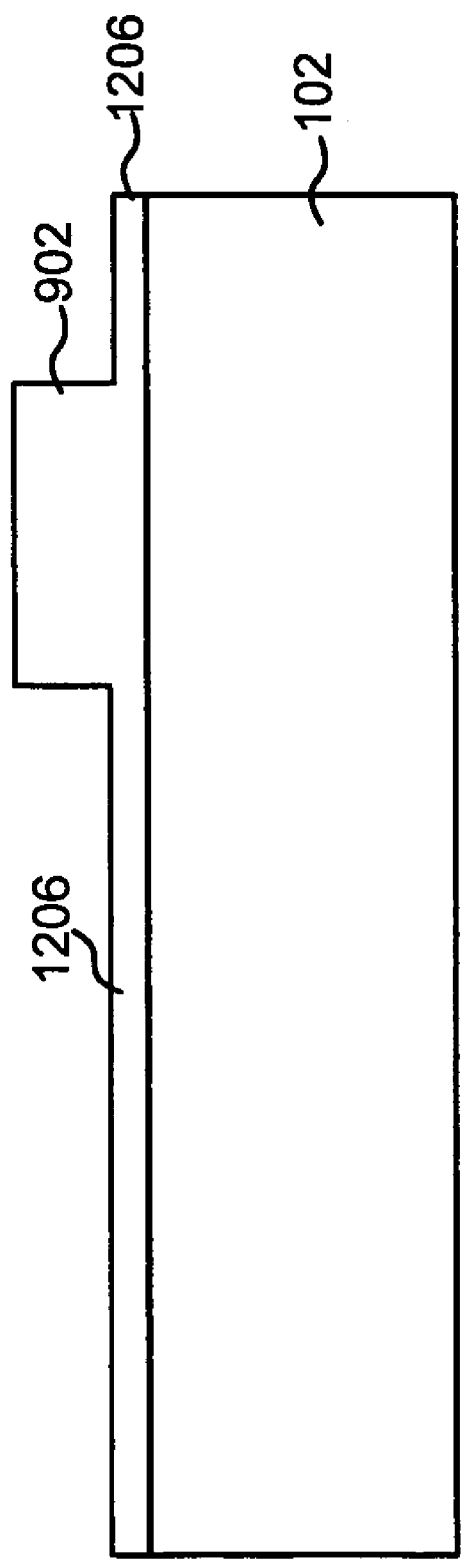
Figure 13:
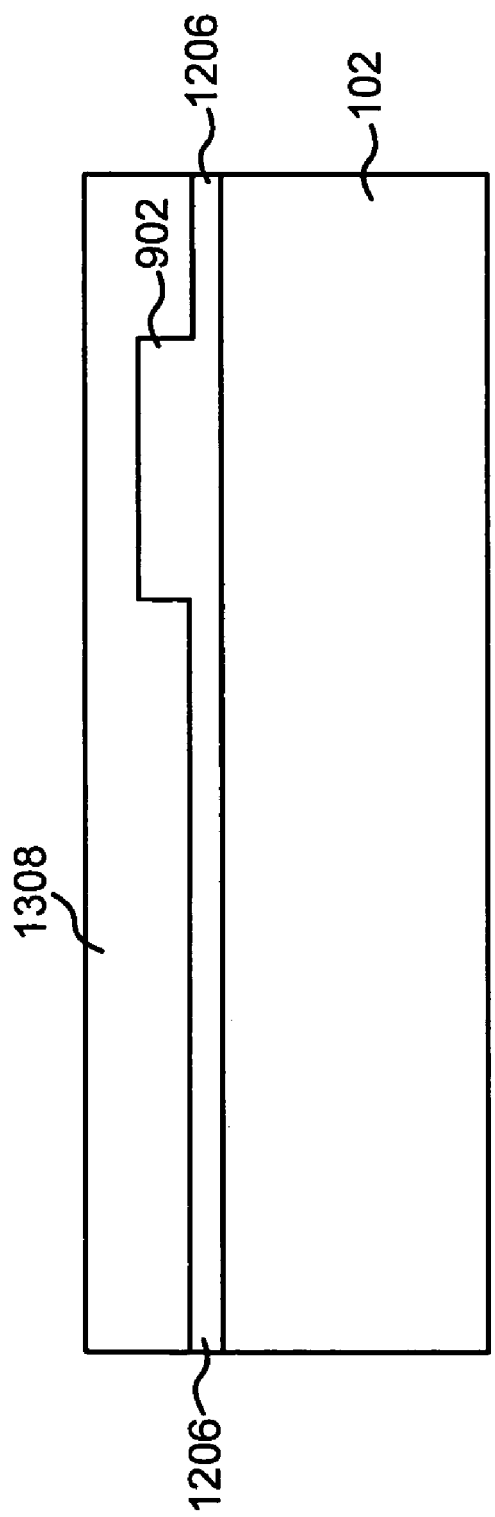

Referring to FIG. 12, a second gate oxide layer 1206 may be formed. Second gate oxide layer 1206 may be a "thin" gate oxide layer that will eventually function as the oxide layer for the lower voltage transistors 208 in the periphery. Second gate oxide layer 1206 may, for instance, be formed to a thickness of approximately 30 Å using a dry oxidation technique at approximately 800° C. More generally, second oxide layer 1206 may be formed to a thickness of between about 25 Å and 70 Å using dry oxidation at a temperature of between about 725° C. and 900° C. Consistent with an aspect of the invention, the dry oxidation may be performed without HCl (hydrogen chloride) present in the ambient atmosphere.

Second gate oxide layer 1206 will generally be formed after the layers 230, 235, 241, and 242 (the AONO stack) were formed in the core region. Conventionally, thin oxides, such as second gate oxide layer 1206, are subjected to thermal annealing using $N_2O$. The $N_2O$ tends to incorporate nitrogen into the oxide file, which makes the film more resistant to breakdown.

Consistent with an aspect of the invention, second gate oxide layer 1206 is not subjected to thermal annealing using $N_2O$. In particular, such an annealing tends to degrade alumina high-K layer 242, which tends to reduce erase speed when erasing using FN tunneling. Additionally, using dry oxidation, without HCl present the ambient atmosphere, prevents aluminum from outgassing from high-K layer 242. By avoiding such outgassing, aluminum contamination of equipment can be minimized or eliminated.

A polysilicon layer 1308 may next be formed (FIG. 13) and then etched back to form thick gate transistors 207 and thin gate transistors 208 (FIG. 14). In this manner, thin gate transistors 208 and thick gate transistors 207 may be formed in periphery region 206 of memory device 100. The formation of the transistors in this manner is advantageous as it does not negatively effect high-K layer 242 in core region 204.

Although thin gate transistors 208 and thick gate transistors 207 were illustrated as being formed by depositing material that is simultaneously used to form layers in both transistors, other implementations may form each transistor stack independently of one another.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a memory device on a substrate comprising:
   forming a memory stack on the substrate, the memory stack including an alumina layer as an intergate dielectric;
   forming a thin gate oxide on the substrate in an area separate from the memory stack using a dry oxidation technique; and
   forming a gate layer on the thin gate oxide,
   wherein the thin gate oxide is formed without subjecting the thin gate oxide to thermal annealing with $N_2O$.

2. The method of forming the memory device recited in claim 1, wherein the thin gate oxide is formed to a thickness of approximately 30 Å.

3. The method of forming the memory device recited in claim 1, wherein the thin gate oxide is formed to a thickness of between approximately 25 Å and 70 Å.

4. The method of forming the memory device recited in claim 3, wherein the dry oxidation of the thin gate oxide is performed at a temperature between about 725° C. and 900° C.

5. The method of claim 1, wherein the dry oxidation is performed without the presence of hydrogen chloride in ambient atmosphere to prevent outgassing of aluminum from the alumina layer.

6. The method of claim 1, wherein forming a memory stack on the substrate includes:
 forming a first dielectric layer for the memory stack;
 forming a charge storing layer on the first dielectric layer;
 forming a second dielectric layer on the charge storing layer; and
 forming the alumina layer on the second dielectric.

7. The method of claim 6, wherein the first and second dielectric layers include silicon oxide.

8. The method of claim 6, wherein the alumina layer includes $Al_2O_3$.

9. The method of claim 1, further comprising:
 forming a thick gate oxide on the substrate in an area separate from the memory stack and separate from the thin gate oxide using a wet oxidation technique; and
 forming a second gate layer on the thick gate oxide.

10. A method of forming a memory device comprising:
 forming an AONO (alumina-oxide-nitride-oxide) memory stack; and
 forming a gate oxide, after formation of the AONO memory stack, using a dry oxidation technique,
 wherein the gate oxide is formed without subjecting the gate oxide to thermal annealing to strengthen the gate oxide against breakdown.

11. The method of claim 10, whereby the alumina of the AONO memory stack does not include defects that otherwise would occur if the gate oxide was subjected to thermal annealing to strengthen the gate oxide against breakdown.

12. The method of claim 10, whereby the memory stack exhibits improved erase speed when using Fowler-Nordheim (FN) erase mechanisms.

13. The method of claim 10, further comprising:
 forming a gate layer over the gate oxide.

14. The method of claim 10, wherein the gate oxide is formed to a thickness of approximately 30 Å.

15. The method of claim 10, wherein the thin gate oxide is formed to a thickness of between approximately 25 Å and 70 Å.

16. The method of claim 15, wherein the dry oxidation of the thin gate oxide is performed at a temperature between about 725° C. and 900° C.

17. The method of claim 10, wherein the dry oxidation is performed without the presence of hydrogen chloride in ambient atmosphere to thereby prevent outgassing of aluminum.

18. A method for forming a solid-state memory device comprising:
 forming a memory cell by:
  forming a first oxide layer of a memory cell,
  forming a charge storing layer on the oxide layer,
  forming a second oxide layer on the charge storing layer, and
  forming an aluminum oxide layer on the second oxide layer; and
 forming a thin film transistor by:
  forming a thin gate oxide using a dry oxidation technique without the presence of hydrogen chloride in ambient atmosphere to prevent outgassing of aluminum from the aluminum oxide layer, and
  forming a gate layer on the thin gate oxide,
  wherein the thin gate oxide is formed without subjecting the thin gate oxide to thermal annealing with $N_2O$.

19. The method of claim 18, wherein the thin gate oxide is formed to a thickness of between approximately 25 Å and 70 Å.

20. The method of claim 19, wherein the dry oxidation of the thin gate oxide is performed at a temperature between about 725° C. and 900° C.

* * * * *